United States Patent
Endo et al.

(10) Patent No.: US 8,883,632 B2
(45) Date of Patent: Nov. 11, 2014

(54) MANUFACTURING METHOD AND MANUFACTURING APPARATUS OF DEVICE

(71) Applicant: ULVAC, Inc., Chigasaki (JP)

(72) Inventors: Youhei Endo, Susono (JP); Shuji Kodaira, Susono (JP); Yuta Sakamoto, Susono (JP); Junichi Hamaguchi, Susono (JP); Yohei Uchida, Susono (JP); Yasushi Higuchi, Susono (JP); Shinya Nakamura, Susono (JP); Kazuyoshi Hashimoto, Susono (JP); Yoshihiro Ikeda, Susono (JP); Hiroaki Iwasawa, Susono (JP)

(73) Assignee: ULVAC, Inc., Chigasaki-Shi (JP)

( * ) Notice: Subject to any disclaimer, the term of this patent is extended or adjusted under 35 U.S.C. 154(b) by 28 days.

(21) Appl. No.: 13/737,875

(22) Filed: Jan. 9, 2013

(65) Prior Publication Data
US 2013/0178059 A1      Jul. 11, 2013

(30) Foreign Application Priority Data

Jan. 10, 2012  (JP) ................................. 2012-002305

(51) Int. Cl.
  *H01L 21/768* (2006.01)
(52) U.S. Cl.
  CPC .... *H01L 21/76882* (2013.01); *H01L 21/76883* (2013.01)
  USPC ......................................................... 438/653

(58) Field of Classification Search
  None
  See application file for complete search history.

(56) References Cited

U.S. PATENT DOCUMENTS

| | | | |
|---|---|---|---|
| 2001/0047932 A1* | 12/2001 | Yu et al. .................. | 204/192.12 |
| 2002/0064952 A1* | 5/2002 | Yu et al. ......................... | 438/688 |
| 2002/0192946 A1* | 12/2002 | Oikawa et al. ................ | 438/637 |
| 2003/0129832 A1* | 7/2003 | Fujikawa et al. ............. | 438/660 |
| 2006/0115982 A1* | 6/2006 | Morisue et al. ............... | 438/638 |

FOREIGN PATENT DOCUMENTS

JP        2011-086825        4/2011

\* cited by examiner

*Primary Examiner* — Charles Garber
*Assistant Examiner* — Stanetta Isaac
(74) *Attorney, Agent, or Firm* — Grossman, Tucker, Perreault & Pfleger, PLLC

(57) ABSTRACT

A manufacturing method of a device including: a first process in which a barrier film is formed on a substrate with a concave portion provided on one surface thereof so as to cover an inner wall surface of the concave portion; a second process in which a conductive film is formed so as to cover the barrier film; and a third process in which the conductive film is melted by a reflow method, wherein the method includes a process α between the second process and the third process, in which the substrate with the barrier film and the conductive film laminated thereon in this order is exposed to an atmosphere under a pressure A for a time period B, and wherein in the process α, control is carried out such that a product of the pressure A and the time period B is not greater than $6 \times 10^{-4}$ [Pa·s].

4 Claims, 6 Drawing Sheets

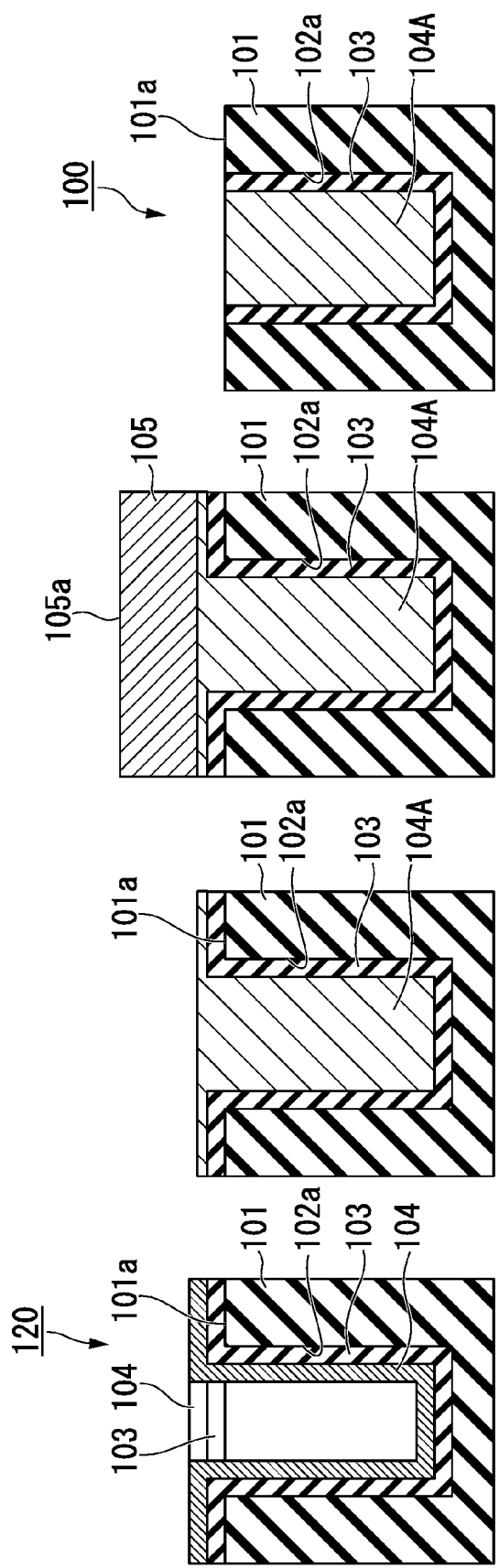

MANUFACTURING METHOD AND MANUFACTURING APPARATUS OF DEVICE

Priority is claimed on Japanese Patent Application No. 2012-002305, filed on Jan. 10, 2012, the contents of which are incorporated herein by reference.

BACKGROUND OF THE INVENTION

1. Field of the Invention

The present invention relates to a manufacturing method and a manufacturing apparatus of a device, which are used for precisely forming a microscopic wiring structure.

2. Description of Related Art

In the related art, aluminum or an aluminum alloy was used as a microscopic wiring material for a semiconductor device and the like formed on a substrate. However, since aluminum has a low melting point and poor migration resistance, it was difficult to meet high integration and increase in a speed required for a semiconductor device.

For this reason, copper has been used as a wiring material in recent years. Although copper is excellent as an LSI wiring material since copper has a higher melting point as compared with aluminum and has low electrical resistivity, it is known that copper is a material on which it is difficult to perform microfabrication. A method for performing microfabrication on a wiring (copper wiring) configured by copper is disclosed in Japanese Unexamined Patent Application, First Publication No. 2011-086825. According to Japanese Unexamined Patent Application, First Publication No. 2011-086825, it is possible to form a copper wiring inside a microscopic groove by forming the groove in an insulating later, embedding copper inside the groove by using a sputtering method, and then removing excess copper protruding out of the groove.

However, the invention disclosed in Japanese Unexamined Patent Application, First Publication No. 2011-086825 has a problem in that it is difficult to embed copper inside the microscopic groove without any gaps. That is, when copper deposited using the sputtering method is embedded inside the groove, an amount of copper deposited on the deepest side inside the groove tends to be smaller than an amount of copper deposited on the side of an opening end. As a result, a cavity may be generated on the deepest side inside the groove.

In addition, when copper melted by using a reflow method is embedded inside the groove, there is a problem in that wettability of melted copper with respect to a barrier metal layer formed in advance on an inner wall surface of the groove is poor and copper is solidified in a state in which a cavity is generated inside the groove.

In any case, a resistance value of the copper wiring rises if a cavity is generated in the copper wiring formed inside the groove, and there is also a possibility of disconnection.

SUMMARY OF THE INVENTION

A purpose of aspects of the present invention is to provide a manufacturing method and a manufacturing apparatus of a device capable of forming a conductive film configured by embedding a conductive material inside a microscopic groove and a hole provided on one surface of a substrate (hereinafter, referred to as a concave portion) without any gaps.

A manufacturing method of a device according to an aspect of the present invention includes: a first process in which a barrier film is formed on a substrate with a concave portion provided on one surface thereof so as to cover at least an inner wall surface of the concave portion; a second process in which a conductive film is formed so as to cover the barrier film; and a third process in which the conductive film is melted by a reflow method, wherein the manufacturing method further includes a process α between the second process and the third process, in which the substrate with the barrier film and the conductive film laminated thereon in this order is exposed to an atmosphere under a pressure A for a time period B, and wherein in the process α, control is carried out such that a product of the pressure A and the time period B is not greater than $6\times10^{-4}$ [Pa·s].

The manufacturing method of a device according to an aspect of the present invention further includes a process β between the first process and the second process, in which the substrate with the barrier film laminated thereon is exposed to an atmosphere under a pressure C for a time period D, wherein in the process β, control is carried out such that a product of the pressure C and the time period D is not greater than $6\times10^{-4}$ [Pa·s].

The manufacturing method of a device according to an aspect of the present invention performs the third process within a temperature range of not higher than 500 [° C.] when a width of the concave portion is not more than 50 [nm].

A manufacturing apparatus of a device according to an aspect of the present invention includes: a first treatment chamber in which a barrier film is formed so as to cover an inner wall surface of a concave portion provided on one surface of a substrate; a second treatment chamber in which a conductive film is formed so as to cover the barrier film; a third treatment chamber in which the conductive film is melted by a reflow method; and a transport chamber which is coupled to each of the first treatment chamber, the second treatment chamber, and the third treatment chamber, wherein the transport chamber includes a transport mechanism that transports a treatment target between the treatment chambers.

The manufacturing method of a device according to aspects of the present invention includes the process α in which a base substance is exposed to the atmosphere under the specific pressure A for a specific time period B after the formation of the conductive film. Then, control is carried out such that the product of the specific pressure A and the time period B is not greater than $6\times10^{-4}$ [Pa·s]. That is, the pressure A and the time period B are respectively controlled to be not greater than specific values in the process α.

Since it is possible to lower the concentration of impurity gas that is present in an atmosphere to which the conductive film is exposed by controlling the pressure A, and to shorten a time period during which the conductive film is exposed to the impurity gas by controlling the time period B, a rate at which the impurity gas is adhered to the conductive film can be reduced. As a result, it is possible to suppress the occurrence of a cavity inside a conductive portion due to the adhesion of the impurity gas when the conductive film is melted to form the conductive portion which functions as a wiring layer, and to thereby enhance a rate of embedment of the conductive portion in the concave portion.

In the configuration of the manufacturing apparatus of a device according to aspects of the present invention, the second treatment chamber for forming the conductive film and the third treatment chamber for melting the conductive film are coupled via the transport chamber. Accordingly, it is possible to expose the treatment target which has been carried out of the second treatment chamber, to an atmosphere under a desired pressure for a desired time period in the transport chamber, before the treatment target is carried into the third treatment chamber, by using the manufacturing apparatus of the present invention, and to thereby realize the manufacturing method of the present invention.

BRIEF DESCRIPTION OF THE DRAWINGS

FIG. 3D is a diagram illustrating the manufacturing method according to the embodiment in a step-by-step manner.

FIG. 3E is a diagram illustrating the manufacturing method according to the embodiment in a step-by-step manner.

FIG. 3F is a diagram illustrating the manufacturing method according to the embodiment in a step-by-step manner.

FIG. 3G is a diagram illustrating the manufacturing method according to the embodiment in a step-by-step manner.

DETAILED DESCRIPTION OF THE INVENTION

Figure 1:
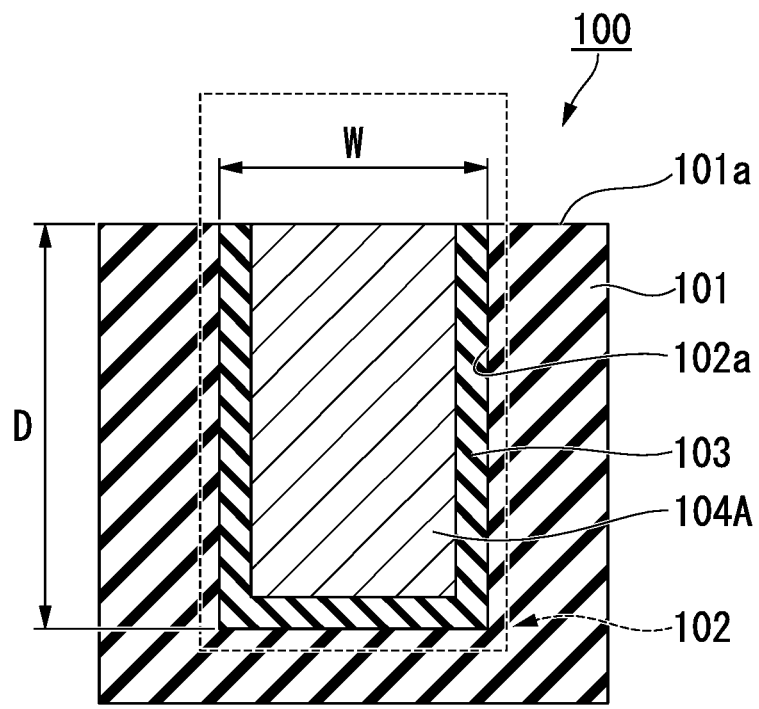
FIG. 1 is an enlarged cross-sectional view of main parts of a device which is obtained by using a manufacturing method according to an embodiment of the present invention.

Hereinafter, a description will be given of the present invention based on preferable embodiments with reference to the drawings. In addition, the embodiments shown below will be described only for illustrative purposes in order to promote understanding of the gist of the present invention and are not intended to limit the present invention unless otherwise noted. In addition, main parts in the drawings used in the following description may be enlarged for convenience in some cases in order to facilitate understanding of characteristics of the present invention, and dimensional ratios and the like of each component are not necessarily the same as actual values.

First Embodiment

Configuration of Device

A description will be given of a configuration example of a device 100 which is obtained by a manufacturing method of a device according to a first embodiment of the present invention with reference to FIG. 1. FIG. 1 is a cross-sectional view of main parts showing a configuration of the device 100. The device 100 is configured by a substrate 101, a groove portion and a hole portion (hereinafter, referred to as a concave portion) 102 provided in one surface 101a of the substrate, a barrier film 103 formed so as to cover an inner wall surface 102a of the concave portion 102, and a conductive film 104 formed so as to cover the barrier film 103.

The substrate 101 is preferably configured by a single material and formed of an insulator such as glass or resin or a semiconductor such as silicon or the like, for example. In addition, a functional device may be formed at a part of the substrate 101.

The concave portion 102 is configured by a groove dug into in a thickness direction of the substrate 101 in a microscopic region. A width of the concave portion (a diameter of an opening surface or a bottom surface) W is formed to 20 [nm] to 50 [nm], for example. In addition, a depth D of the concave portion is formed to 80 [nm] to 200 [nm], for example.

The barrier film 103 is formed so as to cover at least the inner wall surface 102a of the concave portion 102 and have a thickness of 1 [nm] to 3 [nm], for example. In addition, the barrier film 103 is configured by Ta (tantalum), Ta nitride, Ta silicide, Ta carbide, Ti (titanium), Ti nitride, Ti silicide, Ti carbide, W (tungsten), W nitride, W silicide, W carbide, Ru (ruthenium), Ru oxide, V (vanadium), V oxide, Co (cobalt), Co oxide, Nb (niobium), or Nb oxide, for example.

The conductive portion 104A is formed of a conductive material such as Cu (copper) so as to be embedded in the concave portion 102. The conductive portion 104A can be caused to function as a circuit wiring of a semiconductor device formed on the substrate 101.

[Manufacturing Apparatus of Device]

Figure 2:
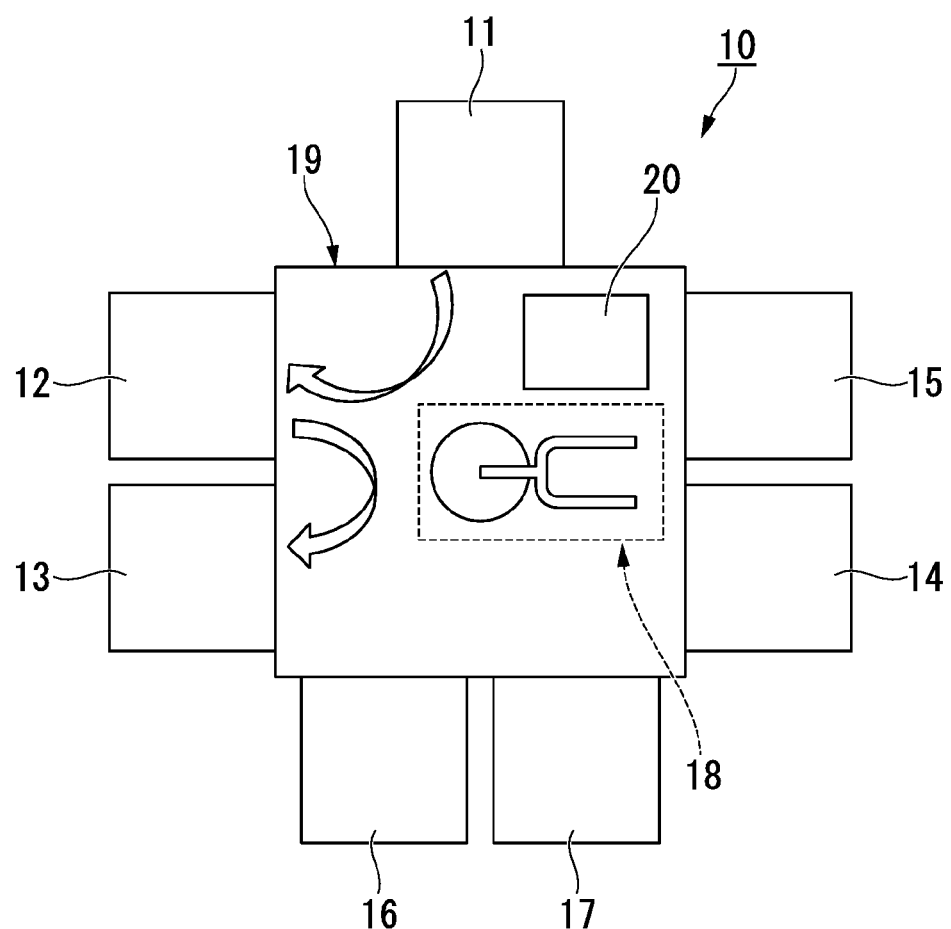
FIG. 2 is a diagram schematically illustrating a configuration of a manufacturing apparatus according to an embodiment of the present invention.

A description will be given of a configuration example of a manufacturing apparatus 10 of the device 100 shown in FIG. 1 with reference to FIG. 2. FIG. 2 is a diagram schematically showing a cross-sectional view of main parts of the manufacturing apparatus 10 which can be used for forming at least the barrier film 103 and the conductive film 104.

The manufacturing apparatus 10 is provided with a first treatment chamber 11, a second treatment chamber 12, a third treatment chamber 13, a fourth treatment chamber 14, and a fifth treatment chamber 15 as process treatment chambers for forming a device 100, and further, the manufacturing apparatus 10 is provided with a loading lock chamber 16 for carrying a treatment target in and an unloading lock chamber 17 for carrying the treatment target out.

The first treatment chamber 11 is a film formation treatment chamber for forming the barrier film 103 so as to cover the inner wall surface 102a of the concave portion 102 provided in one surface 101a of the substrate 101. The second treatment chamber 12 is a film formation treatment chamber for forming the conductive film 104 so as to cover the barrier film 103. The third treatment chamber 13 is a thermal treatment chamber in which the conductive film 104 is melted by the reflow method. The fourth treatment chamber 14 is a treatment chamber in which a degassing treatment is performed on the treatment target. The fifth treatment chamber 15 is a treatment chamber in which a cleaning treatment is performed on the treatment target. In addition, although the manufacturing apparatus 10 with the five treatment chambers provided as process treatment chambers is shown as an example in FIG. 2, the manufacturing apparatus 10 may be further provided with other treatment chambers.

In addition, the manufacturing apparatus 10 is further provided with a transport chamber 19 which is separately coupled to at least the first treatment chamber 11, the second treatment chamber 12, and the third treatment chamber 13 and includes a transport means 18 of the treated target between the treatment chambers. In addition, each of the treatment chambers 11, 12, 13, 14, 15, and the transport chamber 19 is provided with a gas exhausting means 20 capable of controlling an inner pressure thereof.

According to the manufacturing apparatus 10 of the device according to the first embodiment, the second treatment chamber 12 for forming the conductive film and the third treatment chamber 13 for melting the conductive film are coupled via the transport chamber 19 as described above. Accordingly, it is possible to expose the treatment target which has been carried out of the second treatment chamber 12, to an atmosphere under a desired pressure for a desired time period in the transport chamber 19, before carrying the treatment target in the third treatment chamber 13, by using the manufacturing apparatus 10, and to thereby realize the manufacturing method of the embodiment.

[Manufacturing Method of Device]

A description will be given of the manufacturing method of the device 100 shown in FIG. 1 with reference to FIGS. 3A to 3G FIGS. 3A to 3G are diagrams showing cross-sectional views of the main parts of the device 100 in a step-by-step manner in an order of manufacturing processes.

Figure 3A:
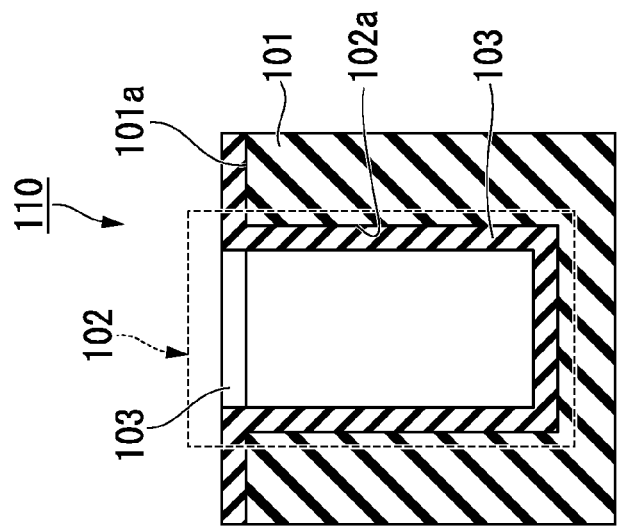
FIG. 3A is a diagram illustrating the manufacturing method according to the embodiment in a step-by-step manner.

First, as shown in FIG. 3A, the substrate 101 with an insulation property is prepared. An insulating substrate such as a glass substrate or a resin substrate or a semiconductor substrate is used as the substrate 101. It is assumed that a functional device (not shown) such as a semiconductor device is provided in advance on one surface 101a of the substrate 101.

Figure 3B:
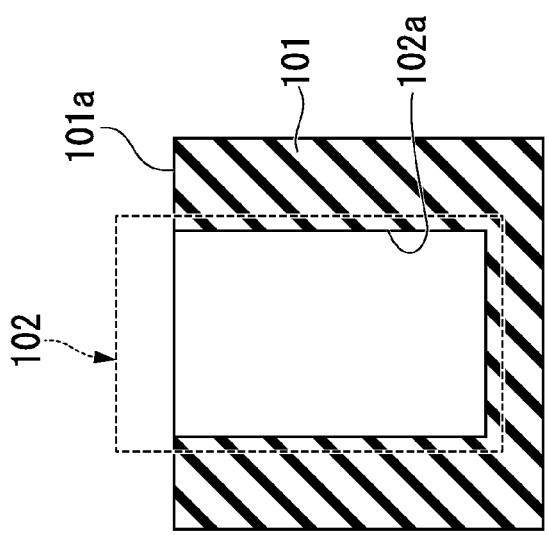
FIG. 3B is a diagram illustrating the manufacturing method according to the embodiment in a step-by-step manner.

Then, the concave portion 102 with a desired shape is formed in one surface 101a of the substrate 101 as shown in FIG. 3B. The concave portion 102 is formed into a pattern in the form of the circuit wiring of the functional device, for example. An etching process with photolithography and a process using laser light can be applied, for example, as a method of forming the concave portion 102.

Figure 3C:
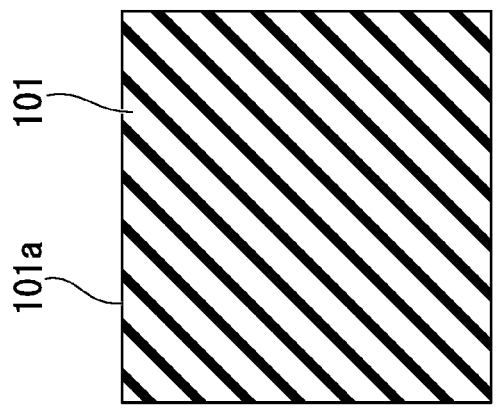
FIG. 3C is a diagram illustrating the manufacturing method according to the embodiment in a step-by-step manner.

Next, a barrier film with a desired thickness (1 [nm] to 3 [nm], for example) is formed on one surface 101a of the substrate 101 which includes at least the inner wall surface 102a of the concave portion 102 as shown in FIG. 3C (a first process). The barrier film 103 is formed by using a sputtering method or a CVD method, for example. A material configured by Ta (tantalum), Ta nitride, Ta silicide, Ta carbide, Ti (titanium), Ti nitride, Ti silicide, Ti carbide, W (tungsten), W nitride, W silicide, W carbide, Ru (ruthenium), Ru oxide, V (vanadium), V oxide, Co (cobalt), Co oxide, Nb (niobium), or Nb oxide, for example, is used as a material configuring the barrier film 103.

It is preferable to perform a process β, in which a base substance 110 obtained by laminating the barrier film 103 on one surface 101a of the substrate 101 after the first process is exposed to an atmosphere under a specific pressure C during a specific time period D, between the first process and a second process described below. In the embodiment, a pressure A is controlled to be not higher than $2 \times 10^{-5}$ [Pa], a time period B is controlled to be not longer than 30 [s], and a product of them is controlled to be not more than $6 \times 10^{-4}$ [Pa·s].

Next, the conductive film 104 is formed so as to cover the barrier film 103 formed in the first process as shown in FIG. 3D (a second process). As a material configuring the conductive film 104, a conductor such as Cu is used. The conductive film 104 can be formed by using the sputtering method, for example.

Then, a process α, in which a base substance 120 obtained by laminating the barrier film 103 and the conductive film 104 in this order on one surface 101a of the substrate 101 after the second process is exposed to an atmosphere under the specific pressure A for a specific time period B, is performed between the second process and a third process described below. In this embodiment, the pressure A is controlled to be not higher than $2 \times 10^{-5}$ [Pa], the time B is controlled to be not longer than 30 [s], and the product of them is controlled to be not more than $6 \times 10^{-4}$ [Pa·s].

Next, the base substance 120 obtained after the process α is heated by the reflow method, and the conductive film 104 is melted so as to fill at least the concave portion 102 as shown in FIG. 3E (a third process).

A heating temperature is controlled to be not higher than a melting temperature of the material configuring the conductive film 104 and not higher than a durable temperature of the base substance 120. When the conductive film 104 is configured by Cu, the heating temperature is set to be not lower than 100° C. and not higher than 400° C.

After the third process, the conductive portion 104A, which is configured by the material obtained by melting the conductive film 104 and functions as a wiring layer, is formed inside the concave portion 102.

Next, an unnecessary part of the barrier film 103 formed on one surface 101a of the substrate 101 and an unnecessary part of the conductive film 104 formed via the barrier film 103 are selectively removed. The selective removal of the unnecessary parts of the barrier film 103 and the conductive film 104 can be performed after two steps described below, for example.

That is, as a first step, the conductive portion 104A which has been already formed is used as a plating seed film (plating catalyst), and plated metal 105 is precipitated on the surface of the conductive portion 104A by a plating method as shown in FIG. 3F (a fourth process). The plated metal film 105 is formed to have a thickness, with which the shapes of the unnecessary parts of the barrier film 103 and the conductive film 104 are not reflected to the shape of an outermost surface 105a thereof, such that the outermost surface 105a is flat.

Subsequently, as a second step, a CMP (Chemical Mechanical Polishing) treatment is performed on a region interposed between the outermost surface 105a of the plated metal film 105 and one surface 101a of the substrate as shown in FIG. 3G (a fifth process). Objects which have been formed on one surface 101a of the substrate 101, including the unnecessary parts of the barrier film 103 and the conductive film 104 formed on one surface 101a of the substrate 101, can be removed by the CMP treatment, along with the plated metal film 105 formed in the first step.

It is possible to manufacture the device 100 shown in FIG. 1 by performing at least the first process, the second process, the process α, the third process, the fourth process, and the fifth process in this order.

According to the manufacturing method of the device according to the first embodiment, the process α in which the base substance 120 is exposed to the atmosphere under the specific pressure A for the specific time period B is provided after the formation of the conductive film 104 as described above. Then, the product of the specific pressure A and the time period B is controlled to be not more than $6 \times 10^{-4}$ [Pa·s]. That is, the pressure A and the time period B are controlled to be not greater than the specific values in the process α.

It is possible to reduce a rate at which impurity gas is adhered to the conductive film 104 since the concentration of the impurity gas that is present in the atmosphere to which the conductive film 104 is exposed can be lowered by the control of the pressure A and a time period during which the conductive film is exposed to the impurity gas can be shortened by the control of the time period B.

As a result, when the conductive portion 104A, which is formed of a material obtained by melting the conductive film 104 and functions as a wiring layer, is formed, it is possible to suppress the occurrence of the cavity inside the conductive portion 104A due to the adhesion of the impurity gas, and to thereby enhance the rate of embedment of the conductive portion 104A in the concave portion 102.

Experimental Example 1

A description will be given of Experimental Example 1, which was performed by using the aforementioned manufacturing method of the device. Experimental Example 1 was performed by using three samples (Samples 1 to 3) of the device 100. All the samples were obtained by performing the first process, the second process, the process α, the third process, the fourth process, and the fifth process in this order after performing a degassing treatment at 300 [° C.] and a dry cleaning treatment by using hydrogen gas. In addition, the barrier films were configured by a compound of Ta while the conductive films were configured by elemental Cu in all the samples.

The thickness of the barrier film in Sample 1 was about 5 [nm]. On the conductive film in Sample 1, a treatment for forming a film with a thickness of 50 [nm] was performed at a temperature of −20 [° C.] by applying RF power of about 18 [kW] by the sputtering method in the second process. In addition, a reflow treatment was performed on the conductive film in Sample 1 at a temperature of 400 [° C.] in the third process. Moreover, if the concave portion 102 was not sufficiently filled with the conductive portion 104A, adjustment may be made by repeatedly performing the second process and the third process a plurality of times and increasing the conductive material to be embedded inside the concave portion 102 as in Samples 2 and 3 described below.

The thickness of the barrier film in Sample 2 was 5 [nm]. The conductive film in Sample 2 was formed by further repeatedly performing the second process and the third process after performing the second process and the third process once. A treatment for forming a film with a thickness of 35 [nm] was performed at a temperature of −20 [° C.] by applying RF power of 18 [kW] by the sputtering method every time the second process was performed. In addition, a reflow treatment was performed at a temperature of 300[° C.] every time the third process was performed.

The thickness of the barrier film in Sample 3 was about 5 [nm]. The conductive film in Sample 3 was formed by performing the second process twice. In the second process performed for the first time, a treatment for forming a film with a thickness of 35 [nm] was performed at a temperature of −20 [° C.] by applying RF power of about 18 [kW] by the sputtering method. Then, in the second process performed for the second time, a treatment for forming a film with a thickness of 40 [nm] was performed at a temperature of 300[° C.] by applying RF power of about 5 [kW] by the sputtering method.

Figure 4A:
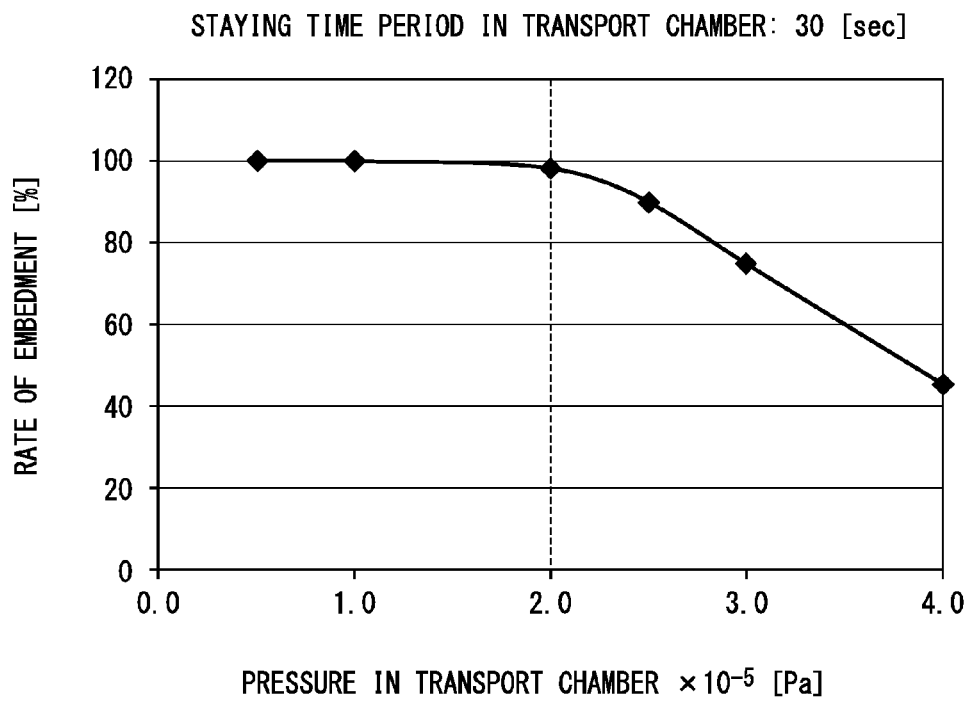
FIG. 4A is a diagram illustrating a relationship between a pressure in a transport chamber and a rate of embedment

FIG. 4A is a graph illustrating a relationship in the process α between the pressure A in a transport chamber 19 provided in a manufacturing apparatus 10 (FIG. 2) of the device and the rate of embedment C of the conductive portion 104A in the concave portion 102 provided in each of Samples 1 to 3 after the third process. The horizontal axis of the graph represents the pressure A, and the vertical axis represents the rate of embedment C. In Experimental Example 1, the time period B during which Samples 1 to 3 were exposed to the atmosphere in the transport chamber 19, namely the time period B during which Samples 1 to 3 were made to stay in the transport chamber was controlled to be 30 [s].

In FIG. 4A, three graphs corresponding to Samples 1 to 3 coincide with each other.

That is, all of Samples 1 to 3 show the same characteristics in terms of the relationship between the pressure A and the rate of embedment C.

In FIG. 4A, the relationship between the pressure A and the rate of embedment C changes at a point at which the pressure A is $2.0 \times 10^{-5}$ [Pa]. That is, when the pressure A is not higher than $2.0 \times 10^{-5}$ [Pa], the rate of embedment C is maintained at 100 [%]. On the other hand, when the pressure A exceeds $2.0 \times 10^{-5}$ [Pa], the rate of embedment C tends to decrease as the pressure A increases.

According to the result of Experimental Example 1, it is possible to enhance the rate of embedment of the conductive portion 104A in the concave portion 102 by controlling the pressure A in the transport chamber 19 to be not higher than $2.0 \times 10^{-5}$ [Pa]. The result is caused by a fact that the concentration of the impurity gas which is present in the atmosphere in the transport chamber 19 is sufficiently lowered and the rate at which the impurity gas is adhered to the conductive film 104 is reduced by lowering the pressure A to be not higher than $2.0 \times 10^{-5}$ [Pa] in the process α. By reducing the adhesion rate of the impurity gas, it is possible to suppress the occurrence of a cavity inside the conductive portion 104A obtained by melting the conductive film 104 due to the impurity gas, and to thereby enhance the rate of embedment of the conductive portion 104A in the concave portion 102.

Experimental Example 2

A description will be given of Experimental Example 2, which was performed by using the aforementioned manufacturing method of the device. Experimental Example 2 was performed by using three samples (Samples 4 to 6) of the device 100. The same treatments as those performed on Samples 1 to 3 used in Experimental Example 1 were performed on Samples 4 to 6, respectively, in the processes other than the process α.

Figure 4B:
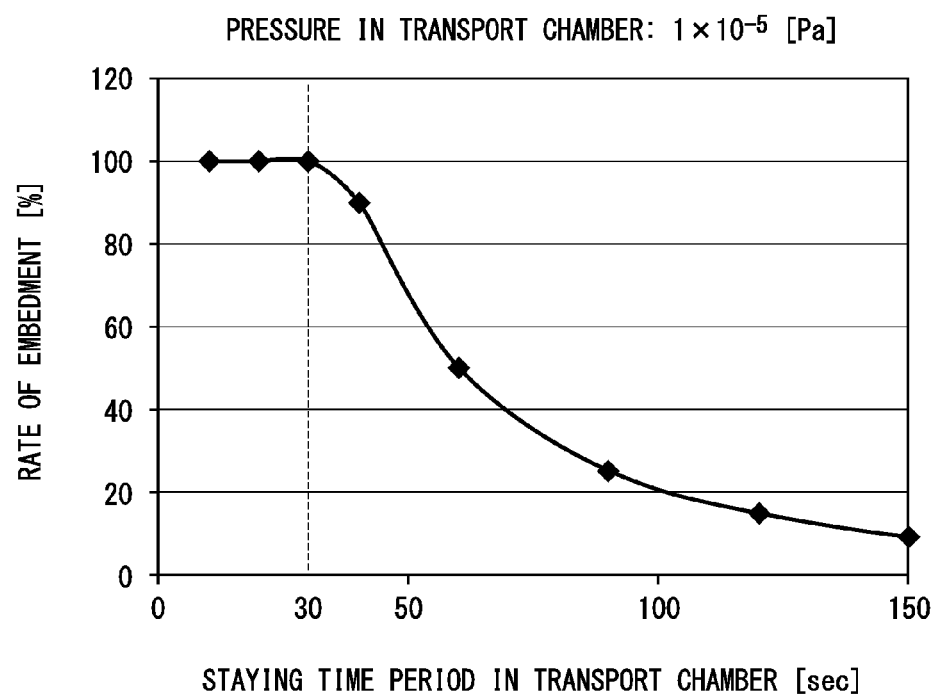
FIG. 4B is a diagram illustrating a relationship between a staying time period in the transport chamber and the rate of embedment.

FIG. 4B is a graph illustrating a relationship in the process α between the time period B during which Samples 4 to 6 were exposed to the atmosphere in the transport chamber 19 provided in the manufacturing apparatus 10 (FIG. 2) of the device (the time period B during which Samples 4 to 6 were made to stay in the transport chamber 19) and the rate of embedment C of the conductive portion 104A in the concave portion 102 provided in each of Samples 4 to 6 after the third process. The horizontal axis of the graph represents the time period B, and the vertical axis represents the rate of embedment C. In addition, the pressure in the transport chamber 19 was controlled to be $1 \times 10^{-5}$ [Pa] in Experimental Example 2.

In FIG. 4B, three graphs corresponding to Samples 4 to 6 coincide with each other. That is, all of Samples 4 to 6 show the same characteristics in terms of the relationship between the time period B and the rate of embedment C.

In addition, in FIG. 4B, the relationship between the time period B and the rate of embedment C changes at a point at which the time period B is 30 [s]. That is, when the time period B is not longer than 30 [s], the rate of embedment C is maintained at 100 [%]. On the other hand, when the time period B exceeds 30 [s], the rate of embedment C tends to decrease as the time period B increases.

According to the result of Experimental Example 2, it is possible to enhance the rate of embedment of the conductive portion 104A in the concave portion 102 by controlling the time period B during which the samples are exposed to the atmosphere in the transport chamber 19 to be not longer than 30 [s]. The result is caused by a fact that the rate at which the impurity gas is adhered to the conductive film 104 is reduced by shortening the time period B to be not longer than 30 [s] in the process α. It is possible to suppress the occurrence of the cavity inside the conductive portion 104A obtained by melting the conductive film 104 due to the impurity gas in the subsequent third process by reducing the adhesion rate of the impurity gas, and to thereby enhance the rate of embedment of the conductive portion 104A in the concave portion 102.

Experimental Example 3

A description will be given of Experimental Example 3, which was performed by using the aforementioned manufacturing method of the device. Experimental Example 3 was performed by using six samples (Samples 7 to 12) of the device 100. The same treatments as those performed on Samples 1 to 3 used in Experimental Example 1 were performed on Samples 7 to 9 respectively in the processes other than the third process. In addition, the same treatments as those performed on Samples 4 to 6 used in Experimental Example 2 were performed on Samples 10 to 12 respectively in the processes other than the third process.

Figure 5A:
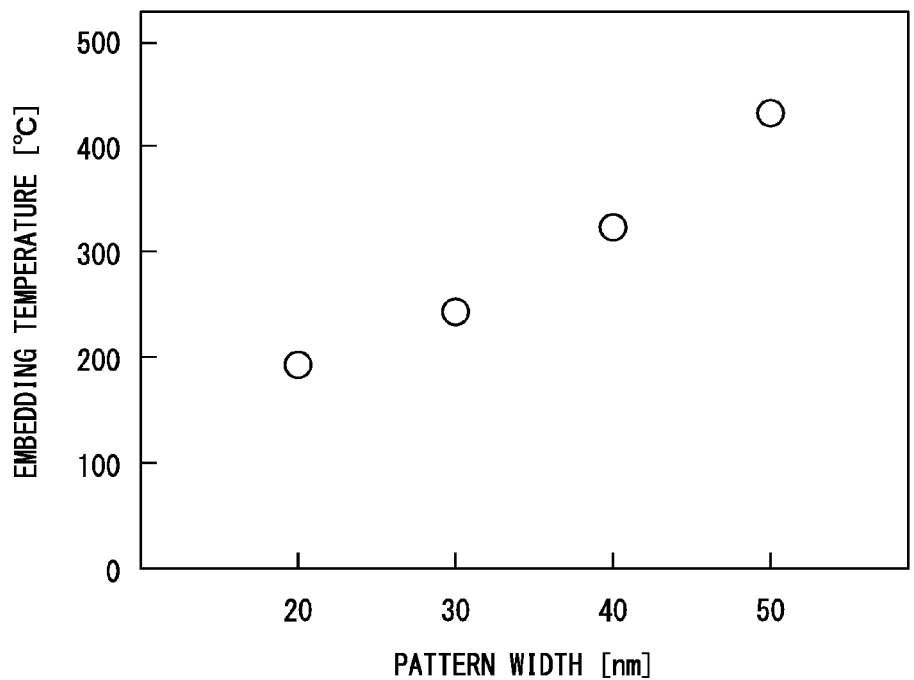
FIG. 5A is a diagram illustrating a relationship between a pattern width of a wiring layer and the rate of embedment
Figure 5B:
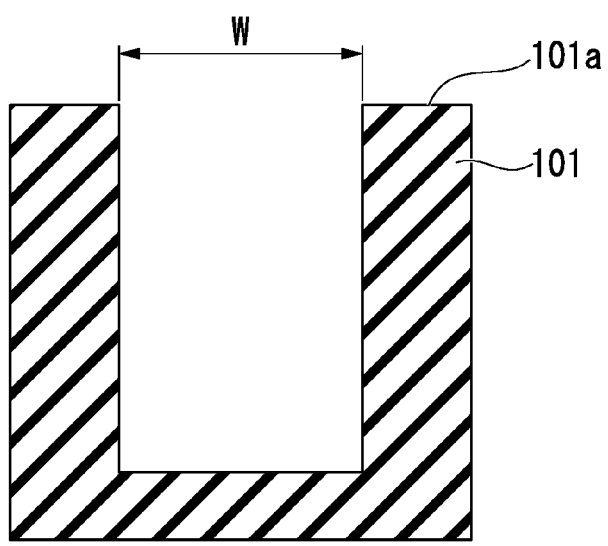
FIG. 5B is a diagram illustrating a definition of the pattern width.

FIG. 5A is a graph illustrating a relationship between a width W of the concave portion 102 formed in one surface 101a of the substrate 101 and an optimal temperature (embedding temperature) of the reflow treatment performed in the third process for the embedment in the width W. The horizontal axis of the graph represents the width W of the concave portion 102, and the vertical axis represents the embedding temperature. In addition, the width W of the concave portion 102 corresponds to the width of the concave portion 102 in a direction which is perpendicular to the thickness direction of the substrate 101 as shown in FIG. 5B.

In FIG. 5A, six graphs corresponding to Samples 7 to 12 coincide with each other. That is, all of Samples 7 to 12 show the same characteristics in terms of the relationship between the width W of the concave portion 102 and the optimal temperature of the reflow treatment.

In addition, in FIG. 5A, when the width of the concave portion 102 is set to be not more than 50 [nm], the embedding temperature tends to be lower as the width is reduced. Accordingly, in the case of the embedment in the concave portion 102 with a width of not more than 50 [nm], it is preferable to perform at least the reflow treatment in the third process in a temperature range of not higher than 500[° C.]

The present invention can be widely applied to a device which is provided with a wiring configured by elemental copper.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A manufacturing method of a device comprising:
a first process in which a barrier film is formed on a substrate with a concave portion provided on one surface thereof so as to cover at least an inner wall surface of the concave portion;
a second process in which a conductive film is formed so as to cover the barrier film; and
a third process in which the conductive film is melted by a reflow method,
wherein the manufacturing method further includes a process α between the second process and the third process, in which the substrate with the barrier film and the conductive film laminated thereon in this order is exposed to an atmosphere under a pressure A for a time period B, and
wherein in the process α, control is carried out such that a product of the pressure A and the time period B is not greater than $6 \times 10^{-4}$ [Pa·s]; and
wherein the pressure A is controlled to be not higher than $2 \times 10^{-5}$ [Pa].

2. The manufacturing method of a device according to claim 1 further comprising:
a process β between the first process and the second process, in which the substrate with the barrier film laminated thereon is exposed to an atmosphere under a pressure C for a time period D,
wherein in the process β, control is carried out such that a product of the pressure C and the time period D is not greater than $6 \times 10^{-4}$ [Pa·s]; and
wherein the pressure C is controlled to be not higher than $2 \times 10^{-5}$ [Pa].

3. The manufacturing method of a device according to claim 1, wherein when a width of the concave portion is not more than 50 [nm], the third process is performed within a temperature range of not higher than 500[° C.].

4. The manufacturing method of a device according to claim 2, wherein when a width of the concave portion is not more than 50 [nm], the third process is performed within a temperature range of not higher than 500[° C.].

* * * * *